United States Patent [19]

Horner

[11] Patent Number: 4,463,321

[45] Date of Patent: Jul. 31, 1984

[54] DELAY LINE CONTROLLED FREQUENCY SYNTHESIZER

[75] Inventor: Jimmy M. Horner, Garland, Tex.

[73] Assignee: E-Systems, Inc., Dallas, Tex.

[21] Appl. No.: 335,148

[22] Filed: Dec. 28, 1981

[51] Int. Cl.³ .......................... H03L 7/16; H03L 7/24
[52] U.S. Cl. ..................................... 331/1 R; 331/10; 331/16; 331/25
[58] Field of Search .................... 331/1 A, 10, 16, 22, 331/25, 1 R

[56] References Cited

U.S. PATENT DOCUMENTS

| 4,048,580 | 9/1977 | Campbell et al. | 331/1 R |
| 4,336,505 | 6/1982 | Meyer | 331/1 R |

*Primary Examiner*—John S. Heyman
*Assistant Examiner*—N. Biase
*Attorney, Agent, or Firm*—Albert M. Crowder, Jr.

[57] ABSTRACT

A frequency synthesizer having a delay line for a controlling element. The output frequency of a voltage controlled oscillator (VCO) is sampled with a directional coupler and input to an in-phase power divider. The first output of the power divider is input to a delay line to provide a delayed signal. The delayed signal and the non-delayed signal from the second output of the power divider are input to a phase detector. The output of the phase detector is a DC voltage representative of the phase difference between the delayed signal and the non-delayed signal. An analog gate inputs the phase detector output to an oscillator driver that controls the VCO. When the phase difference deviates from a predetermined level the oscillator driver outputs an error voltage to adjust the VCO until the proper phase difference is achieved which will be a condition of phase lock wherein the output frequency is phase locked to the delay line. The predetermined phase difference is determined by the delay of the delay line and the characteristics of the phase detector. A digital-to-analog converter also controls the oscillator driver providing a coarse tuning control for entering new frequency data. A strobe signal will open the analog gate, thus disconnecting the phase detector, when new frequency data is input. When the analog gate is closed the frequency synthesizer will again seek a phase lock condition.

17 Claims, 3 Drawing Figures

DELAY LINE CONTROLLED FREQUENCY SYNTHESIZER

TECHNICAL FIELD

The present invention relates to frequency synthesizers and in particular to a frequency synthesizer controlled by a delay line.

BACKGROUND OF THE INVENTION

Frequency synthesizers have normally been fabricated to selectively combine a plurality of internally generated frequencies derived from a common source to produce an output signal which is adjustable over a given frequency range. Changing the synthesizer frequency involves switching from one set of input frequencies to another to obtain the desired output frequency. Such synthesizers have many varied applications. For example, they are used as variable frequency generators and as controlled local oscillators for receivers. They are also employed for programmable frequency applications. Frequency synthesizers may be used to provide coded frequency shifts in secure communication devices.

One type of frequency synthesizer is known as an indirect synthesizer and consists of a voltage controlled oscillator from which a signal sample is obtained and then divided down and compared with a fixed reference oscillator. The resulting difference signal is then applied to the control input of the voltage controlled oscillator resulting in a frequency change. Another divide and compare cycle is initiated with the difference signal again being applied to the voltage controlled oscillator control line. The frequency of the synthesizer is changed by changing the division ratio. This type of synthesizer utilizes time consuming counting techniques. For higher frequencies these counting techniques must be combined with frequency conversion techniques.

A second type of frequency synthesizer is known as a direct synthesizer and consists of a multitude of internally generated signals from a common high stability reference oscillator. The internally generated signals are selectively combined to produce the desired output signal frequency. The synthesizer frequency is varied by selecting different combinations of internally generated signals. This type of frequency synthesizer is complicated and has a restricted upper frequency limit.

In view of the above problems there exists a need for a frequency synthesizer that is relatively simple and is independent of external frequency references.

SUMMARY OF THE INVENTION

A selected embodiment of the present invention comprises a frequency synthesizer controlled by a delay means. The signal from a frequency generating means is sampled and then split into two signals of equal phase. One of these divided signals is delayed through a delay means and then applied to one input of a phase detecting means. The second divided signal is applied to a second input of the phase detecting means. The output of the phase detecting means is then input to a controlling means for generating a control signal. The control signal controls the output frequency of the frequency generating means. The controlling means will vary the control signal until a predetermined phase difference between the delayed signal and the second output of the dividing means is achieved. This predetermined phase difference is determined by the delay of the delay means and the characteristics of the phase detecting means. When this predetermined phase is achieved the frequency of the frequency generating means will be phase locked to the delay line.

BRIEF DESCRIPTION OF THE DRAWINGS

For a more complete understanding of the present invention and the advantages thereof, reference is made to the following description taken in conjunction with the accompanying drawings in which.

DETAILED DESCRIPTION OF THE INVENTION

Figure 1:
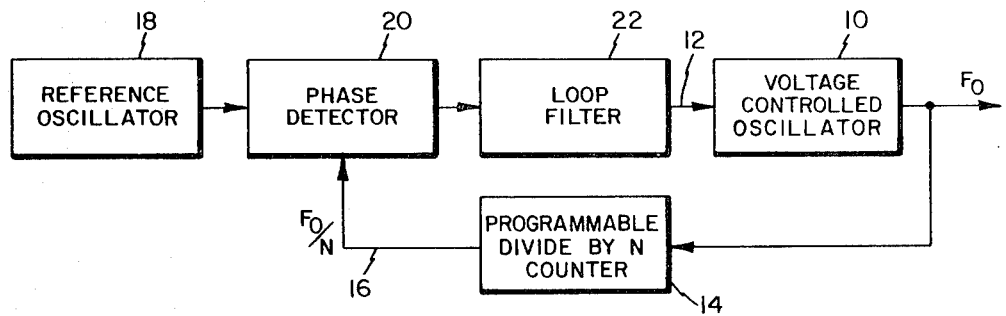
FIG. 1 is a block diagram of a prior art system.

Referring to FIG. 1, there is shown an example of a prior art system for a phase locked loop (PLL) frequency synthesizer. The main component for the PLL is the voltage controlled oscillator 10 (VCO) having an output frequency $F_0$ that is a function of a control voltage applied on line 12. The output frequency $F_0$ is input to a programmable divided-by-N counter 14 to provide a low frequency component $F_0/N$ on line 16. The low frequency component $F_0/N$ on line 16 and a signal from a reference oscillator 18 are input to a phase detector 20. The output of phase detector 20 is input to a loop filter 22 that outputs a control voltage on line 12 to vary the frequency of the VCO 10.

When the divided frequency $F_0/N$ on line 16 is equal in both frequency and phase to the output of the reference oscillator 18, the loop consisting of the VCO 10, the programmable divide-by-N counter 14, the phase detector 20 and the loop filter 22 will be in a condition called phase lock.

By changing the divide ratio of the programmable divide-by-N counter 14, a different frequency $F_0/N'$ will appear on line 16 corresponding to a new divide ratio $N'$. The phase detector 20 will produce an error signal on line 12 causing the VCO 10 to shift frequency from $F_0$ to the desired frequency $F'_0$. The VCO 10 will be shifted until the divided frequency on line 16 is once again equal in phase and frequency to the output of the reference oscillator 18.

The output frequency $F_0$ of the VCO 10 can be stepped through discrete frequency increments that are exact subharmonics of the reference oscillator 18. The only limitation is presented by the type of divide-by-N counter 14 that is utilized.

Figure 2:
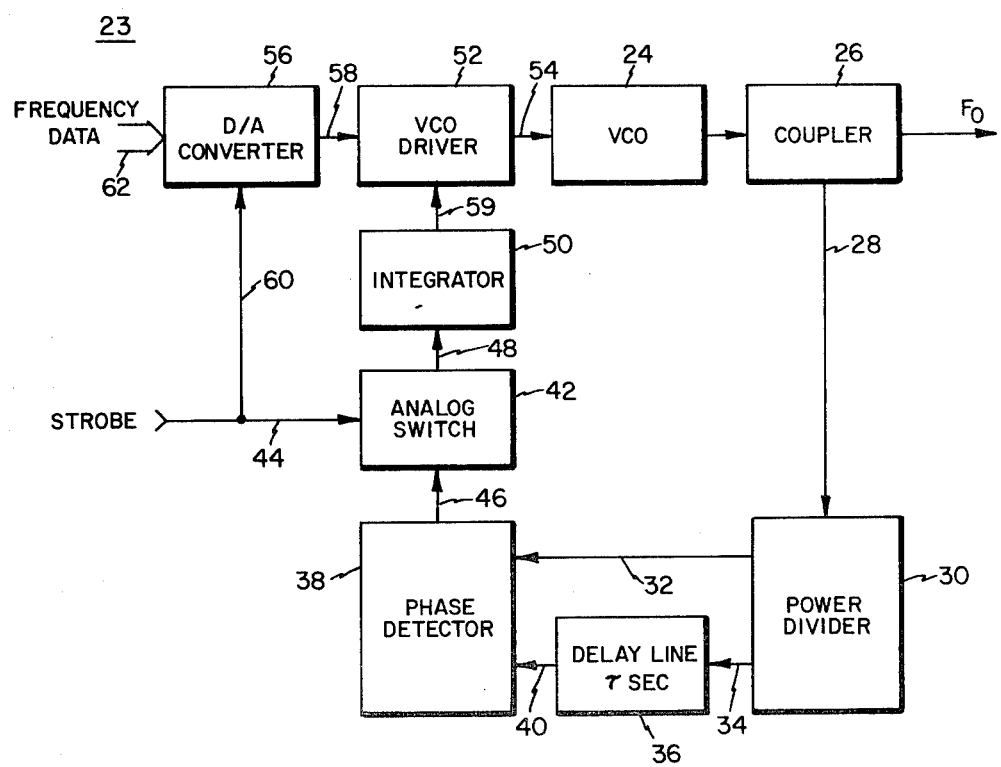
FIG. 2 is a block diagram of the present invention.

Referring now to FIG. 2, there is shown a block diagram of a frequency synthesizer 23 in accordance with the present invention. The output of a voltage controlled oscillator (VCO) 24 is connected to a directional coupler 26. The directional coupler 26 is chosen to operate in the frequency band of the VCO 24. The direct output of the coupler 26 provides an output signal with a frequency $F_0$ to drive circuits such as a mixer (not shown) which is an inherent part of a receiver. The coupled output of the coupler 26 will have a frequency $F_0$ and an output level approximately 10 to 20 DB down from the output level of the VCO 24.

This coupled output is input to an in phase power divider 30 through a line 28 to provide two equi-phase signals on lines 32 and 34. The power level of the signals on lines 32 and 34 is equal and 3 DB down from the power level on line 28 at the input to the in phase power divider 30. The phase difference between the signals on line 32 and 34 is zero degrees. The in phase power divider 30 may be of the type termed an in phase Wilkinson divider. An in phase Wilkinson divider equally divides an input signal into two equal phase output signals.

The signal on line 34 is input to a delay line 36 that is comprised of a length of transmission line having a group delay of $\tau$ seconds. Delay line 36 is normally fabricated of a length of coaxial cable with a teflon dielectric having an intrinsic impedance of 50 ohms. The output of the delay line 36 is input to the first input of a phase detector 38 through a line 40. The second input of phase detector 38 appears on line 32 which is the non-delayed output of the in phase power divider 30. The phase detector 38 is normally comprised of a double balanced mixer which outputs the phase difference of two signals with the same frequency. The phase detector 38 measures the relative phase difference between the signal on line 32 and the signal on line 40. This phase difference is the amount of phase shift of the delay line 36 at the output frequency $F_0$ of the VCO 24.

The output of phase detector 38 is input to an analog switch 42 which is of the type HI-200 manufactured by Harris Semiconductor. The analog switch 42 is controlled by a strobe signal on line 44 which connects the output signal from the phase detector 38 on line 46 to the output of the analog switch 42 on line 48 when the strobe signal is not present.

The output of the analog switch 42 on line 48 is input to an integrator 50. When the analog switch 42 is in the closed position the phase detector output on line 46, which is a DC signal representative of the phase difference between the delayed and non-delayed signals on line 40 and 32 respectively, will be input to the integrator 50. The integrator 50 then transforms the phase detector 38 output signal into a control signal on a line 59 that is input to a VCO driver 52. The VCO driver 52 then applies a control signal to VCO 24 on control line 54.

The output of a D/A converter 56 is applied to the VCO driver 52 along a line 58. The D/A converter 56 is normally of the type HI-562 manufactured by Harris Semiconductor. The strobe signal that is input to the analog switch 42 along line 44 is also input to the D/A converter 56 along line 60. Digital information containing the frequency data is input to the D/A converter 56 along data bus 62.

When the strobe signal is in a state such that the analog switch 42 is open, thus disconnecting the output of phase detector 38 from the intergrator 50, the D/A converter 56 converts the digital information on data bus 62 to a control voltage on line 58 that controls VCO driver 52. This applies a coarse tuning voltage to the VCO 24 on control line 54. When the analog switch 42 is again closed the VCO driver 52 will sum the coarse tuning voltage from the D/A converter 56 with the output of the phase detector 38.

Operation of the circuit of FIG. 2 can be given in more detail as follows. The VCO 24 output frequency $F_0$ is input to the power divider 30. The output signals of power divider 30 on lines 32 and 34 have a phase difference of zero degrees. Delay line 36 delays the signal on line 34 by $\tau$ seconds and the resulting signal on line 40 is input to the phase detector 38. The phase detector 38 then compares the signal on line 40 and the signal on line 32 and outputs the phase difference on line 46 as a DC voltage. The output of the phase detector 38 is a cosine function such that a 90° phase difference will output a zero voltage. When the output between the delayed signal and the in-phase signal is 90° then the frequency synthesizer 23 is in a locked condition. When the phase difference deviates from 90° the output of the phase detector 38 will increase or decrease, depending upon the phase difference. This detected output is input to the integrator 50 and a voltage other than zero will cause the output of integrator 50 to increase or decrease, thus causing the VCO driver 52 to generate an error voltage on line 54 to change the frequency of VCO 24. The frequency of the VCO 24 changes until the output of the phase detector is zero volts.

An analysis of the frequency synthesizer 23 will demonstrate the requirements for lock. Assuming a pure sinusoidal output signal of the form $V \sin \omega t$ where:

V = amplitude in volts $\omega = 2\pi F$ where F is the frequency of the input signal in cycles per second, and t = time in seconds.

The signal on line 32 will be defined by the equation:

$e_1 = V \sin \omega t$

The signal on line 34 will be defined by the equation:

$e_2 = V \sin \omega t.$

The signal on line 34 is passed through the delay line 36 wherein the output signal on line 40 will be:

$e_2 = V \sin (\omega t + \omega \tau).$

The phase detector 38 receives the signals on line 32 and line 40 and the output will be the product of these two signals which is defined by the equation:

$S = V^2 \sin \omega t \sin (\omega t + \omega \tau).$
$S = V^2/2[\cos (\omega t + \omega \tau - \omega t) - \cos (\omega t + \omega \tau + \omega t)].$ Although not shown the phase detector will cause the sum product to be filtered leaving:

$S = V^2/2 [\cos \omega \tau].$

Loop phase lock is defined as a condition where the output of a phase detector 38 is zero. This condition will occur when:

$S = 0 = V^2/2 [\cos \omega \tau]$ where $\omega \tau = \dfrac{\pi}{2}, \dfrac{3\pi}{2}, \dfrac{5\pi}{2}, \ldots \dfrac{n\pi}{2};$ n is an odd number.

However, a further condition is imposed on the loop when using a cosine phase detector as in the present embodiment. When the frequency synthesizer 23 loses lock the phase detector 38 output decreases if the phase difference increases to, for example, 100 degrees. The integrator 50 will transform this signal into an error voltage that will cause the frequency of the VCO 24 to decrease thus reobtaining lock by adjusting the phase difference to 90°. If, for example, the phase difference on losing lock is 280°, the output of the phase detector 38 will be positive and it will cause the integrator 50 to generate an error signal that will cause the frequency of the VC 24 to increase until the phase difference is 450°. Even though the phase detector 38 output is zero at a phase difference of 270° the slope of the curve is positive and the error voltage generated on line 54 will be of the wrong polarity. As can be seen the frequency synthesizer will only lock for $$\omega\tau = \frac{\pi}{2}, \frac{5\pi}{2}, \frac{9\pi}{2}, \ldots$$

or for every 360° increment of 90°. The lock range will be from −90° to 270°. This determines the minimum step increment of the synthesizer ($\Delta F$) or $$\Delta F\tau = 3600.$$

Were $\Delta F$ is in cycles per second and $\tau$ is in seconds, then $$\Delta F = \frac{1}{\tau}.$$

As an example, if $\tau = 0.5$ microseconds, then:

$$\Delta F = \frac{1}{.5 \times 10^{-6}} = 2\text{MHz}$$

The minimum frequency increment of the delay line is 2 MHz.

The course tuning data input to the D/A converter 56 on data bus 62 provides a control voltage on line 58 to adjust the VCO driver 52 to a range that will allow operation over only one frequency increment. The phase detector will then seek the null point where the phase output on line 46 is 90° (zero volts) thereby achieving phase lock in a predetermined increment. By applying a strobe signal to line 44 and line 60 the analog switch 42 will be opened and the loop will "free run" under the control of the D/A converter 56. Another frequency increment can then be input to the D/A converter 56 on data bus 62 thereby adjusting the VCO 24 to another frequency range. The strobe signal is then removed and the phase detector 38 will again be reconnected to the integrator 50. The frequency synthesizer 23 will then achieve lock as described above.

Figure 3:
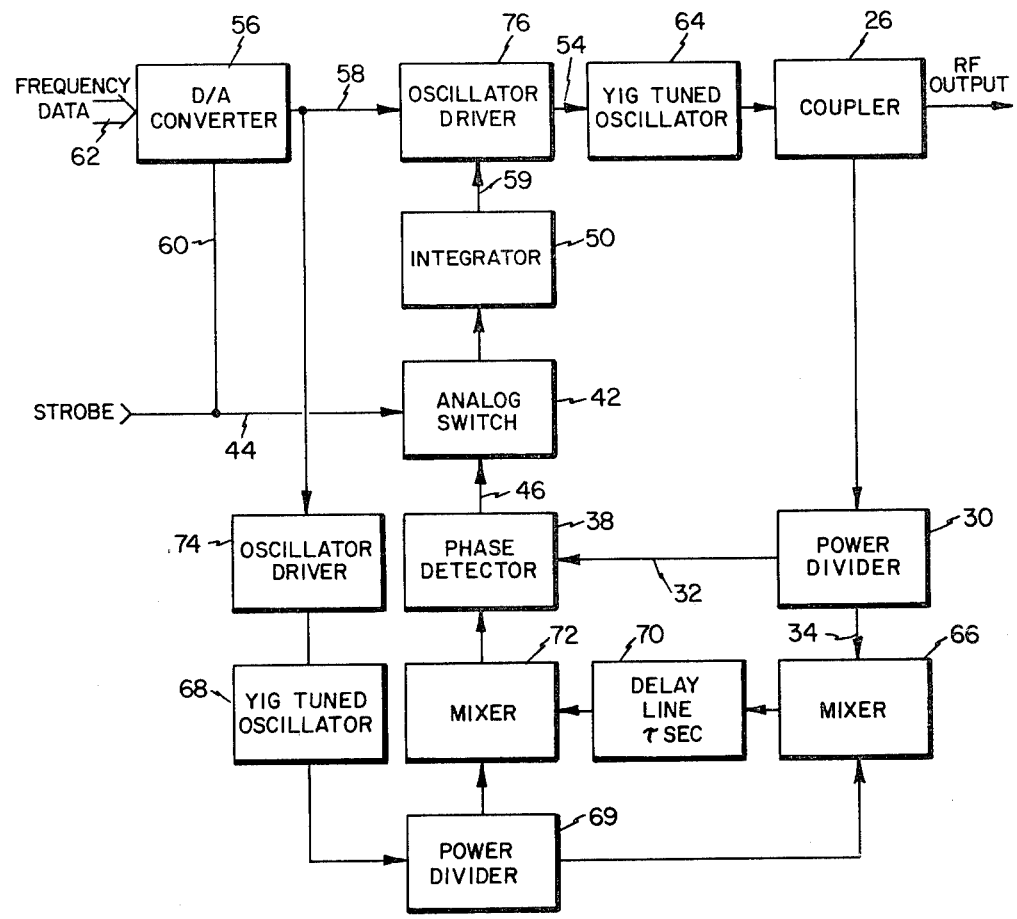
FIG. 3 is a block diagram of another embodiment of the present invention.

Now referring to FIG. 3, there is shown another embodiment of the invention. In this embodiment a YIG tuned oscillator 64 (Yttrium Iron Garnet) replaces the VCO 24 of FIG. 2. The output of the YIG oscillator 64 is input to a coupler 26 to supply a coupled signal to the power divider 30 as in the configuration of FIG. 2. The main distinction is that the signal on line 34 is now input to a mixer 66. A second YIG oscillator 68 supplies the local oscillator signal that is input to a power divider 69. One output of the power divider 69 is input to the mixer 66 to down convert the signal on line 34 to an intermediate frequency and input it to a delay line 70. The delayed output signal from the delay line 70 is then input to a second mixer 72 which is driven by the other output of the power divider 69 to up convert the delayed signal from the delay line 70. The two local oscillator outputs from the power divider 69 are in phase. The output of mixer 72 and the signal on line 32 are at the same frequency and are input to phase detector 38. The loop will then obtain phase lock as described above with reference to FIG. 2.

The advantage of using a down converted system is that the delay line 70 operates at a lower frequency which results in a lower delay line loss. A typical device utilized for delay lines at lower frequencies is a surface acoustic wave (SAW) delay line. The YIG oscillator 68, which acts as a local oscillator for both mixer 72 and mixer 66, and the YIG oscillator 64 are driven by the oscillator drivers 74 and 76 respectively. When new frequency data is input to the D/A converter 56 and a strobe signal opens the analog switch 42, the oscillator driver 74 tunes the YIG oscillator 68 to produce the required intermediate frequency of the delay line 70. The oscillator driver 76 operates in a similar manner to the VCO driver 52 of FIG. 2.

Although a preferred embodiment of the invention has been described in detail it should be understood that various changes, substitutions and alterations can be made therein without departing from the spirit and scope of the invention as defined in the appended claims.

I claim:
1. A frequency synthesizer comprising:
   frequency generating means for generating an output signal at the synthesized frequency;
   dividing means for dividing the output signal into a first and second divided signal, said first divided signal in phase with said second divided signal;
   delay means for delaying said first divided signal to provide a delayed signal;
   phase detecting means for detecting the phase difference between said second divided signal and said delayed signal, whereby a phase detected output is generated;
   controlling means for receiving the phase detected output and converting the phase detected output into a control signal, said control signal controlling said frequency generating means, wherein the frequency of said frequency generating means is adjusted until a predetermined phase difference between said delayed signal and said second divided output is achieved thereby providing an output frequency that is phase locked to said delay means, said predetermined phase difference determined by the amount of delay in said delay means and the characteristics of said phase detecting means; and
   adjusting means for disconnecting said phase detected output from said controlling means and simultaneously adjusting the frequency range of said frequency generating means.
2. A frequency synthesizer as defined in claim 1 wherein said frequency generating means comprises a voltage controlled oscillator (VCO).
3. A frequency synthesizer as defined in claim 1 wherein said frequency generating means comprises a yttrium iron garnet (YIG) tuned oscillator.
4. A frequency synthesizer as defined in claim 1 further including a coupling means connected between said frequency generating means and said dividing means, wherein said coupling means comprises a directional coupler.
5. A frequency synthesizer as defined in claim 1 wherein said dividing means comprises an in-phase power divider.
6. A frequency synthesizer as defined in claim 1 wherein said dividing means comprises an in phase Wilkinson divider.

7. A frequency synthesizer as defined in claim 1 wherein said delay means comprises a length of transmission line.

8. A frequency synthesizer as defined in claim 1 wherein said delay means comprises a length of coaxial cable.

9. A frequency synthesizer as defined in claim 1 wherein said delay means comprises:
- a first mixer for down converting said first divided signal to an intermediate frequency;
- a delay line;
- a second mixer for up converting the output signal of said delay line from said intermediate frequency to the frequency of said second divided signal, and
- a local oscillator for driving said first and second mixer.

10. A frequency synthesizer as defined in claim 9 wherein said delay line is comprised of a surface acoustic wave device (SAW).

11. A frequency synthesizer as defined in claim 9 wherein said local oscillator is comprised of a yttrium iron garnet tuned oscillator (YIG).

12. A frequency synthesizer as defined in claim 1 wherein said phase detecting means comprises a double balanced mixer.

13. A frequency synthesizer as defined in claim 1 wherein said controlling means comprises:
- an analog switch having an input and an output, said input connected to the output of said phase detecting means,
- an oscillator driving circuit having a first and second input, said oscillator driving circuit generating a control signal for controlling said frequency generating means, said second input connected to the output of such analog switch, wherein the frequency of said frequency generating means is adjusted until a predetermined phase difference between said delayed signal and said second divided output is achieved thereby providing an output frequency that is phase locked to said delay means, said predetermined phase difference determined by the amount of delay in said delay means and the characteristics of said phase detecting means; and
wherein said adjusting means includes:
- a digital to analog converter for providing a coarse adjustment for said oscillator driving circuit wherein a control signal to said analog switch disconnects the input of said analog switch from the output of said analog switch thereby disconnecting said phase detected output from said oscillator driving circuit and allowing a coarse adjustment signal from said digital to analog converter to freely adjust said frequency generating means independent of said phase detected output and and when said analog switch is closed said phase detecting means drives said oscillator driving circuit to generate an error signal until phase lock is obtained.

14. A frequency synthesizer comprising:
- a voltage controlled oscillator;
- a directional coupler for coupling the output signal of said voltage controlled oscillator;
- an in phase power divider for dividing the output of said coupler into a first and second divided signal;
- a delay line for delaying said first divided signal;
- a phase detector for detecting the phase difference between said second divided signal and said delayed signal thereby a phase detected output is generated;
- an analog switch having an input and an output, said input connected to said phase detected output of said phase detector;
- an oscillator driving circuit having a first and second input, said oscillator driving circuit generating a control signal for controlling said voltage controlled oscillator, said second input connected to the output of said analog switch, wherein the frequency of said voltage controlled oscillator is adjusted until a predetermined phase difference between said delayed signal and said second divided output is achieved thereby providing an output frequency that is phase locked to said delay line, said predetermined phase difference determined by the amount of delay in said delay line and the characteristics of said phase detector; and
- a digital-to-analog converter for providing a coarse adjustment for said oscillator driving circuit wherein a control signal to said analog switch disconnects the input of said analog switch from the output of said analog switch thereby disconnecting said phase detected output from said oscillator driving circuit and allowing a coarse adjustment signal from said digital-to-analog converter to freely adjust said voltage controlled oscillator independent of said phase detected output and when said analog switch is closed said phase detector drives said oscillator driving circuit to generate an error signal until phase lock is obtained.

15. A frequency synthesizer comprised of:
- a yttrium garnet iron (YIG) tuned oscillator;
- a directional coupler for sampling the output of said voltage controlled oscillator;
- an in phase power divider for dividing the output of said coupler into a first and second divided signal;
- a first mixer for downconverting said first divided signal to an intermediate frequency;
- a delay line for delaying said downconverted signal to provide a delayed signal;
- a second mixer for upconverting said delayed signal to the frequency of said second divided signal;
- a YIG tuned local oscillator for driving said first and second mixer;
- a phase detector for detecting the phase difference between said second divided signal and said delayed signal whereby a phase detected output is generated;
- an analog switch having an input and output, said input connected to said phase detected output of said phase detector;
- an oscillator driving circuit having a first and second input, said oscillator driving circuit for generating a control signal for controlling said YIG oscillator, said second input connected to the output of said analog switch, wherein the frequency of said YIG tuned oscillator is adjusted until a predetermined phase difference between said delayed signal and said second divided output is achieved thereby providing an output frequency that is phase locked to said delay line, said predetermined phase difference determined by the amount of delay in said delay line and the characteristics of said phase detector;
- a digital-to-analog converter for providing a coarse adjustment for said oscillator driving circuit wherein a control signal to said analog switch disconnects the input signal of said analog switch from the output of said analog switch thereby disconnecting said phase detected output from said oscillator driving circuit and allowing a coarse adjustment signal from said digital-to-analog converter to adjust said YIG tuned oscillator independent of said phase detected output and when said analog switch is closed said phase detector causes said oscillator driving circuit to generate an error signal until phase lock is obtained.

16. A frequency synthesizer comprising:

frequency generating means for generating an output signal at the synthesized frequency;

dividing means for dividing the output signal into a first and second divided signal, said first divided signal in phase with said second divided signal;

a first mixer for down converting said first divided signal to an intermediate frequency;

a delay line for delaying said down converted signal to povide a delayed signal;

a second mixer for up converting the output signal of said delay line from said intermediate frequency to the frequency of said second divided signal;

a local oscillator for driving said first and second mixer;

phase detecting means for detecting the phase difference between said second divided signal and said delayed signal, whereby a phase detected output is generated; and controlling means for receiving the phase detected output and converting the phase detected output into a control signal, said control signal controlling said frequency generating means, wherein the frequency of said frequency generating means is adjusted until a predetermined phase difference between said delayed signal and said second divided output is achieved thereby providing an output frequency that is phase locked to said delay means, said predetermined phase difference determined by the amount of delay in said delay line and the characteristics of said phase detecting means.

17. A frequency synthesizer comprising:

frequency generating means for generating an output signal at the synthesized frequency;

dividing means for dividing the output signal into a first and second divided signal, said first divided signal in phase with said second divided signal;

delay means for delaying said first divided signal to provide a delayed signal;

phase detecting means for detecting the phase difference between said second divided signal and said delayed signal, whereby a phase detected output is generated;

an analog switch having an input and an output, said input connected to the output of said phase detecting means;

an oscillator driving circuit having a first and second input, said oscillator driving circuit generating a control signal for controlling said frequency generating means, said second input connected to the output of said analog switch, wherein the frequency generating means is adjusted until a predetermined phase difference between said delayed signal and said second divided output is achieved thereby providing an output frequency that is phase locked to said delay means, said predetermined phase difference determined by the amount of delay in said delay means and the characteristics of said phase detecting means; and a digital to analog converter for providing a coarse adjustment for said oscillator driving circuit wherein a control signal to said analog switch disconnects the input of said analog switch from the output of said analog switch thereby disconnecting said phase detected output from said oscillator driving circuit and allowing a coarse adjustment signal from said digital to analog converter to freely adjust said frequency generating means independent of said phase detected output and when said analog switch is closed said phase detecting means drives said oscillator driving circuit to generate an error signal until phase lock is obtained.

* * * * *